United States Patent [19]
Koelling

[11] Patent Number: 5,600,277
[45] Date of Patent: Feb. 4, 1997

[54] APPARATUS AND METHOD FOR A NMOS REDUNDANCY FUSE PASSGATE CIRCUIT USING A VPP SUPPLY

[75] Inventor: Jeffrey E. Koelling, Dallas, Tex.

[73] Assignee: Texas Instruments Incorporated, Dallas, Tex.

[21] Appl. No.: 437,760

[22] Filed: May 9, 1995

[51] Int. Cl.⁶ .................................. G11C 7/00
[52] U.S. Cl. .................... 327/526; 327/525; 327/408; 327/407; 365/228.7; 326/10; 326/113
[58] Field of Search .................. 327/408, 525, 327/526, 524, 407, 403, 404, 536; 326/9, 10, 113; 365/200, 225.7

[56] References Cited

U.S. PATENT DOCUMENTS 5,359,559  10/1994  Nomura et al. .................... 365/200
5,402,390  3/1995  Ho et al. ............................. 327/525

*Primary Examiner*—Timothy P. Callahan
*Assistant Examiner*—Dinh T. Le
*Attorney, Agent, or Firm*—William Holloway; Robby Holland; Richard Donaldson

[57] ABSTRACT

A redundancy passgate circuit is implemented in NMOS technology in order to provide a more rapid transmission of the transmitted signals. The circuit provides for the more rapid signal transmission by reducing the capacitance experienced by the input signals. The reduced capacitance loading is achieved at the expense of a greater layout area and a requirement for an on-chip power supply.

13 Claims, 2 Drawing Sheets

5,600,277

APPARATUS AND METHOD FOR A NMOS REDUNDANCY FUSE PASSGATE CIRCUIT USING A VPP SUPPLY

BACKGROUND OF THE INVENTION

1. Field of the Invention

This invention relates generally to data processing system integrated circuit components and, more particularly, to the redundancy fuse circuits typically used in dynamic random access memory (DRAM) circuits to choose between a logic signal and the complement of the logic signal.

2. Description of the Related Art

An example of a redundancy passgate circuit implemented in complementary metal oxide semiconductor (CMOS) technology, according to the related art, is shown in FIG. 1. The signal Ax_is applied to a first conduction terminal of passgate transistor P11. The second conduction terminal of passgate transistor P11 is coupled to the OUTPUT signal terminal. The signal Ax is applied to a first conduction terminal of passgate transistor P12, while a second conduction terminal of passgate P12 is coupled to the OUTPUT signal terminal. The n-channel gate of passgate transistor P11 is coupled to the p-channel gate of passgate P12, to a drain terminal of p-channel transistor T13, and to a drain terminal of n-channel transistor T14 and to a gate terminal of n-channel transistor T15. The n-channel terminal of passgate transistor P12 is coupled to the p-channel gate of passgate P11, to a gate terminal of p-channel transistor T13, to a gate terminal of n-channel transistor T14, to a drain terminal of n-channel transistor T15, to a first terminal of fuse F11, and to a drain terminal of n-channel transistor T12. The SET signal terminal is coupled to a gate terminal of n-channel transistor T12 and to a gate terminal of p-channel transistor T11. A source terminal of n-channel transistor T12, a source terminal of transistor T15, and a source terminal of transistor T14 are coupled to ground terminal. A drain terminal of transistor T11 is coupled to a second terminal of fuse F11, while a source terminal of transistor T11 is coupled to the supply terminal. A source terminal of transistor T13 is coupled to the power supply terminal.

Previous generations of dynamic random access memory units have implemented redundancy fuse circuits using CMOS passgates, such as illustrated in FIG. 1, to chose between a binary logic signal and its complement logic signal. But as the amount of redundancy has been increased on the DRAMs, a need has been felt for passgate circuits operating at higher frequencies which have lowered gate capacitance.

SUMMARY OF THE INVENTION

The foregoing and other features are accomplished, according to the present invention, by a redundancy fuse passgate circuit which is implemented in n-channel metal oxide semiconductor (NMOS) technology and which requires an additional (pumped) voltage supply (VPP). The set terminal applies a signal to the fuse circuit. In response to the set terminal signal, the fuse circuit applies a signal to the input terminal of an inverting amplifier. The input terminal and the output terminal of the inverting amplifier apply signals to the gate terminals of the transistors which select the complementary signals for transmission therethrough to the output terminal.

These and other features of the present invention will be understood upon reading of the following description in conjunction with the Figures.

DESCRIPTION OF THE PREFERRED EMBODIMENT(S)

1. Detailed Description of the Drawings FIG. 1 has been described with reference to the related art.

Figure 2:
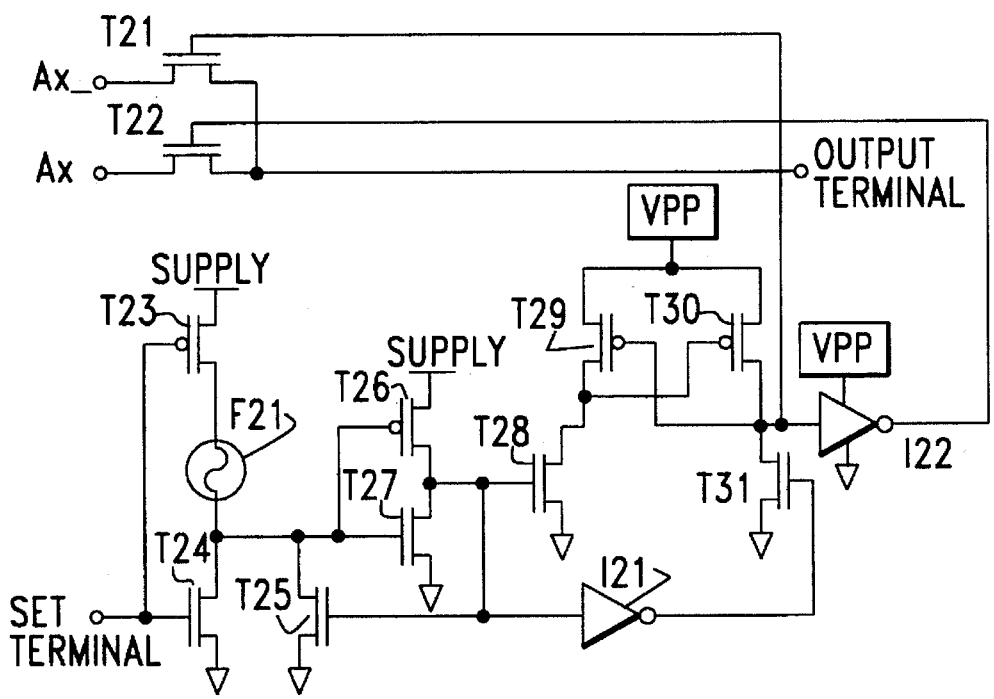
FIG. 2 is a schematic circuit diagram of a redundancy passgate circuit according to the present invention.

Referring now to FIG. 2, a redundancy passgate circuit according to the present invention is shown. Signal Ax_is applied to a first conduction terminal of n-channel semiconductor field effect transistor T12, while signal Ax is applied to a first conduction terminal of n-channel semiconductor field effect transistor T22. A second conduction terminal of transistor T21 and a second conduction terminal of transistor T22 are coupled to the OUTPUT signal terminal. A SET signal terminal is coupled to a gate terminal of n-channel semiconductor field effect transistor T24 and to a gate terminal of p-channel semiconductor transistor T23. A source terminal of transistor T23 is coupled to the SUPPLY terminal while the drain terminal of transistor T23 is coupled to a first terminal of fuse F21. A source terminal of transistor T24 is coupled to the ground terminal while the drain terminal of transistor T24 is coupled to a second terminal of fuse F21, to a drain terminal of n-channel semiconductor field effect transistor T25, to a gate terminal of n-channel semiconductor field effect transistor T27, and to a gate terminal of p-channel semiconductor filed effect transistor T26. The source terminal of transistor T25 is coupled to the ground terminal. The gate terminal of transistor T25 is coupled to an input terminal of inverting amplifier I21, to drain terminal of transistor T26, to a drain terminal of transistor T27, and to a gate terminal of n-channel semiconductor field effect transistor T28. A source terminal of transistor T27 is coupled to the ground terminal, while the drain terminal of transistor T26 is coupled to the supply terminal. The source terminal of transistor T28 is coupled to the ground terminal, while the drain terminal of transistor T28 is coupled to a drain terminal of p-channel semiconductor field effect transistor T29 and to a gate terminal of p-channel filed effect transistor T30. The source terminals of transistors T29 and T30 are coupled to the VPP terminal. The drain terminal of transistor T30 is coupled to the gate terminal of transistor T29, to the drain terminal of n-channel semiconductor field effect transistor T31, to the input terminal of inverting amplifier I22, and to the gate terminal of transistor T21. The output terminal of inverting amplifier I22 is coupled to the gate terminal of transistor T22.

Figure 3:
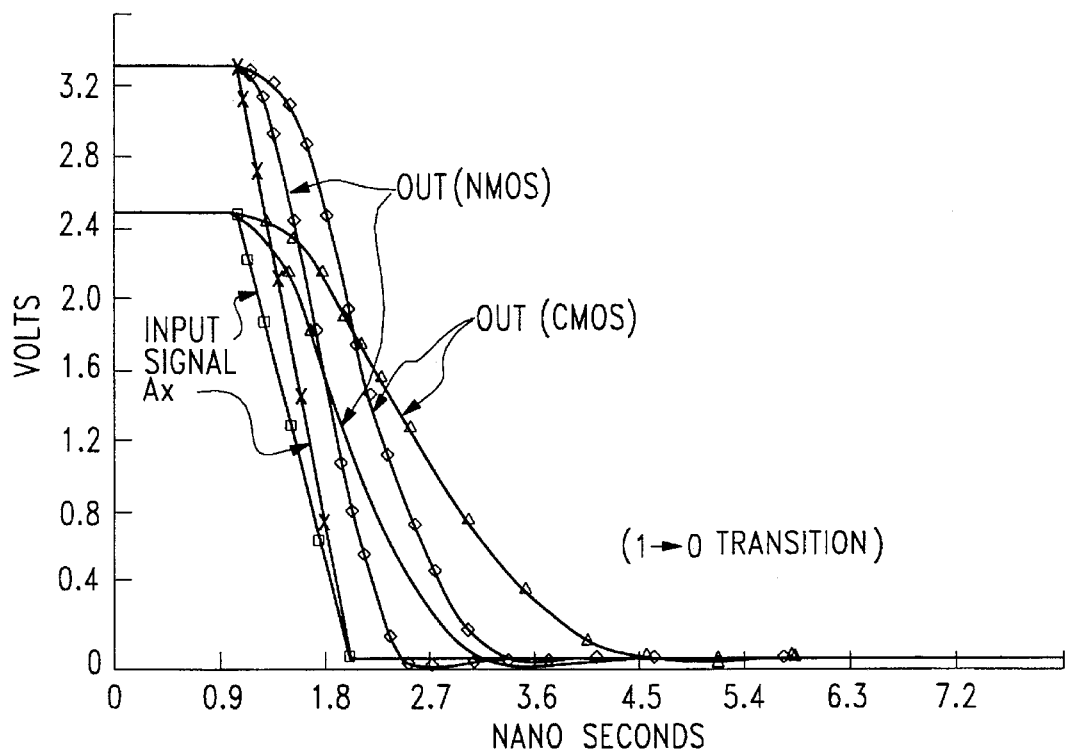
FIG. 3 is a graph comparing a response time of a passgate according to the present invention to the response time of a prior art circuit for a 0→1 logic signal transition.
Figure 4:
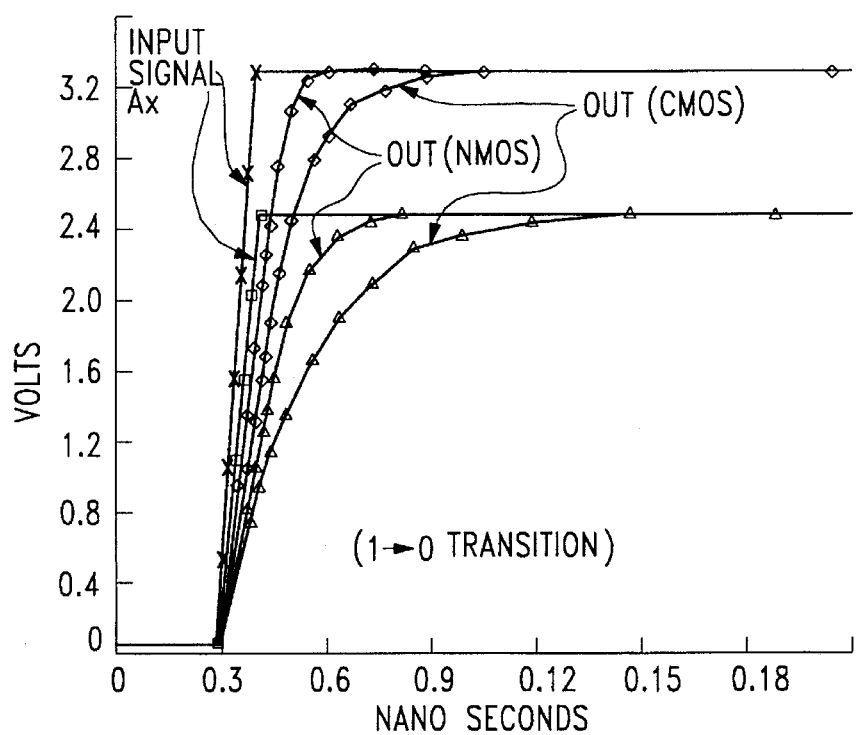
FIG. 4 is a graph comparing the response time of a passgate according to the present invention to the response time of a prior art circuit for a 1→0 logic signal transition.

FIGS. 3 and 4 compare the response times of the passgate of the present invention (i.e., implemented in NMOS technology) with the response times of prior art circuits (i.e., implemented in CMOS technology) for the 1→0 and the 0→1 logic signal transitions, respectively.

2. Operation of the Preferred Embodiment(s)

Figure 1:
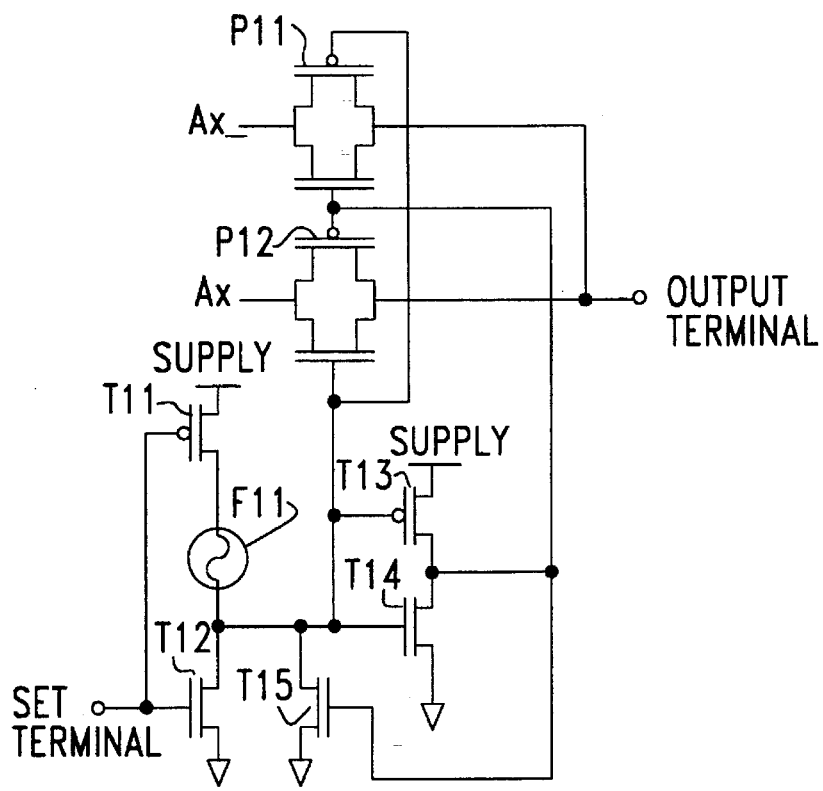
FIG. 1 is a schematic circuit diagram of a redundancy passgate circuit according to the related art.

The redundancy fuse passgate circuit of FIG. 1 has been used in previous implementation of DRAM units. This circuit uses CMOS passgates to determine whether the Ax or the Ax_signal will be applied to the output terminal. When the fuse is intact, the Ax signal will be applied to the output terminal by means of passgate P12. When the fuse is blown, the Ax_signal will be transferred to the output terminal by means of passgate P11. The present invention reduces the capacitance loading placed on the Ax and the Ax_signal. The reduction in capacitance is provided by NMOS passgates T21 and T22 while reducing the capacitance seen by the Ax and Ax_input signals. The advantage of this circuit is a faster signal transfer of the input signals to the output terminal. As can be seen from FIG. 3 and FIG. 4, the NMOS units of the present invention are approximately 50% faster than the circuits of the related art implemented in CMOS technology. A disadvantage of the NMOS passgate circuit of the present invention is the greater layout area on the chip in comparison to the CMOS passgate circuit of FIG. 1. A further disadvantage of the present invention is the requirement for an on-chip pumped power supply, VPP. The pumped voltage supply level VPP, which is greater than the supply voltage level, provides a higher gate voltage to transistors T21 and T22. The higher gate voltage compensates for the effects of voltage drops across transistors T21 and T22 and permits the full Ax and Ax_signal levels to be transmitted across these transistors.

While the invention has been described with particular reference to the preferred embodiment, it will be understood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is intended that the claims shall cover all modifications and applications as do not depart from the spirit and scope of the invention.

What is claimed is:

1. A redundancy passgate fuse circuit energized by a first power source and a pump power source for providing a voltage greater than said first power source, said circuit comprising:

a first and a second NMOS passgate transistor, said first and said second transistors having a common output terminal, said first transistor having a data signal applied to an input terminal thereof, said second transistor having a complement signal of said data signal applied to an input terminal thereof:

a first circuit for applying a first control signal to said first transistor and for applying a complementary signal to said second transistor, said first circuit being energized by said pump power source; and a fuse component including a fuse, said fuse component responsive to a set signal for applying an input signal to said first circuit, wherein said input signal is determined by a status of said fuse, said input signal controlling which of said first and second transistors transmits a signal, said fuse component being energized by said first power source, said pump power source providing that said data signal and said complement signal are transmitted by said first and said second transistor without attenuation.

2. The fuse circuit of claim 1 wherein said first circuit includes an inverting amplifier.

3. The fuse circuit of claim 2 wherein a control terminal of said first transistor is coupled to an input terminal of said inverting amplifier and a control terminal of said second transistor is coupled to an output terminal of said inverting amplifier.

4. The fuse circuit of claim 3 wherein said pump power source is an on-chip pump power source.

5. The fuse circuit of claim 4 wherein said fuse circuit includes said on-chip pump power source.

6. The method for providing a redundancy passgate circuit, the method comprising the steps of:

applying an input signal to a first NMOS passgate transistor;

applying a complement signal of said input signal to a second NMOS passgate transistor;

applying complementary intermediate signals to control terminals of said first and said second NMOS passgate transistors said complementary intermediate signals being provided by an intermediate circuit energized by a pump power source in response to a state of a first signal; and applying a set signal to a fuse circuit, wherein said fuse circuit is energized by a first power source, a state of a fuse in said fuse circuit determining a state of said first signal, wherein said pump power source has a voltage level greater than said first power source, said pump power source providing that input signal and said complement signal are transmitted through said first and said second NMOS passgate transistors without attenuation.

7. The method of claim 6 further comprising the step of energizing said intermediate circuit with an on-chip positive pump power source.

8. The method of claim 7 wherein said applying complementary signals step includes the step of applying an input signal of an inverting amplifier to said first passgate transistor control terminal and applying an output signal of said inverting amplifier to said second passgate transistor control terminal.

9. A redundancy passgate circuit comprising:

a fuse circuit for receiving a set signal, said fuse circuit including a fuse, a state of said fuse determining a state of an output intermediate signal of said fuse circuit when said set signal is applied to said fuse circuit, wherein said fuse circuit is energized by a first power source;

an intermediate circuit responsive to a state of said output intermediate signal for providing a control signal and a complement of said control signal, wherein said intermediate circuit is energized by a pump power source, said pump power source providing a higher voltage than said first power source;

a first NMOS passgate transistor having a control terminal with said control signal applied thereto, said first NMOS passgate transistor having a data signal applied to an input terminal thereof; and a second NMOS passgate transistor having a control terminal with said complement of said control signal coupled thereto, said second NMOS transistor having a complement signal of said data signal applied to an input terminal thereof, wherein said pump power source provides that said data signal and said complement signal are transmitted through said first and said second NMOS passgate transistors without attenuation.

10. The circuit of claim 9 wherein said intermediate circuit includes:

a level-shifting unit; and an inverting amplifier, an output signal of said level-shifting unit applied to said inverting amplifier.

11. The circuit of claim 10 wherein said pump power source is an on-chip pump power source.

12. The circuit of claim 11 wherein said fuse circuit includes a fuse coupled between a p-channel transistor and an n-channel transistor, wherein said set signal is applied to gate terminal of said p-channel transistor and said n-channel transistor.

13. The circuit of claim 12 further including a second inverting amplifier, said second inverting amplifier coupled between said n-channel transistor and said level-shifting unit.

* * * * *